United States Patent [19]
Keeth

[11] Patent Number: 6,069,504
[45] Date of Patent: *May 30, 2000

[54] ADJUSTABLE OUTPUT DRIVER CIRCUIT HAVING PARALLEL PULL-UP AND PULL-DOWN ELEMENTS

[75] Inventor: Brent Keeth, Boise, Id.

[73] Assignee: Micron Technnology, Inc., Boise, Id.

[ * ] Notice: This patent is subject to a terminal disclaimer.

[21] Appl. No.: 09/146,473

[22] Filed: Sep. 3, 1998

Related U.S. Application Data

[63] Continuation of application No. 08/779,344, Jan. 6, 1997, Pat. No. 5,838,177.

[51] Int. Cl.$^7$ .................................................. H03K 5/00
[52] U.S. Cl. ........................ 327/108; 327/112; 327/170; 327/436
[58] Field of Search ............................ 327/108–112, 170, 327/333, 427, 434, 436, 437; 326/82, 83, 86–88

[56] References Cited

U.S. PATENT DOCUMENTS

| | | | |
|---|---|---|---|
| 4,096,402 | 6/1978 | Schroeder et al. | 327/77 |
| 4,183,095 | 1/1980 | Ward | 365/189 |
| 4,404,474 | 9/1983 | Dingwall | 327/170 |
| 4,638,187 | 1/1987 | Boler et al. | 326/27 |
| 4,758,743 | 7/1988 | Dehganpour et al. | 326/27 |
| 4,789,796 | 12/1988 | Foss | 326/87 |
| 4,829,199 | 5/1989 | Prater | 326/27 |
| 4,888,498 | 12/1989 | Kadakia | 327/546 |
| 4,958,088 | 9/1990 | Farah-Bakhsh et al. | 326/24 |
| 4,961,010 | 10/1990 | Davis | 326/27 |
| 4,984,204 | 1/1991 | Sato et al. | 365/189.11 |
| 4,992,676 | 2/1991 | Gerosa et al. | 326/27 |
| 5,001,369 | 3/1991 | Lee | 326/58 |
| 5,055,713 | 10/1991 | Watanabe et al. | 326/87 |

(List continued on next page.)

FOREIGN PATENT DOCUMENTS

| | | |
|---|---|---|
| 0382124 | 8/1990 | European Pat. Off. . |
| 0450871 | 10/1991 | European Pat. Off. . |
| 0599631 | 6/1994 | European Pat. Off. . |
| 0655741 | 5/1995 | European Pat. Off. . |
| 0680049 | 11/1995 | European Pat. Off. . |
| 3 832 378 | 12/1989 | Germany . |
| 2-112317 | 4/1990 | Japan .................... H03K 17/16 |
| 2-119427 | 5/1990 | Japan . |
| 4-90620 | 3/1992 | Japan . |

(List continued on next page.)

OTHER PUBLICATIONS

Chapman, et al., "A Low–Cost High–Performance CMOS Timing Vernier for ATE", *IEEE International Test Conference*, 459–468, (1995).

Lijuslin, et al., "An Integrated 16–channel CMOS Time to Digital Converter", *Nuclear Science Symposium & Medical Imaging Conference* vol. 1, IEEE Conference Record, 625–629, (1993).

(List continued on next page.)

*Primary Examiner*—Kenneth B. Wells
*Attorney, Agent, or Firm*—Dorsey & Whitney LLP

[57] ABSTRACT

An output driver circuit offers control and logic level adjustment for high speed data communications in a synchronous memory such as a synchronous dynamic random access memory (SDRAM). Level adjustment is obtained by resistive division between a termination resistor and controllable impedances between an output node and VDD and VSS power supplies. Control functions include slew rate modification of the signal at the output node, by sequentially turning on or off output transistors in response to a transition in an input signal. Different schemes of weighting the output transistors obtains different characteristics of the output signal. Load matching circuitry and voltage level forcing circuitry is described for improving high frequency operation.

20 Claims, 14 Drawing Sheets

U.S. PATENT DOCUMENTS

| | | | |
|---|---|---|---|
| 5,111,075 | 5/1992 | Ferry et al. | 326/27 |
| 5,122,690 | 6/1992 | Bianchi | 326/87 |
| 5,128,560 | 7/1992 | Chern et al. | 326/81 |
| 5,128,563 | 7/1992 | Hush et al. | 326/87 |
| 5,134,311 | 7/1992 | Biber et al. | 327/108 |
| 5,150,186 | 9/1992 | Pinney et al. | 326/87 |
| 5,165,046 | 11/1992 | Hesson | 327/111 |
| 5,179,298 | 1/1993 | Hirano et al. | 326/83 |
| 5,194,765 | 3/1993 | Dunlop et al. | 326/87 |
| 5,220,208 | 6/1993 | Schenck | 326/27 |
| 5,220,209 | 6/1993 | Seymour | 326/27 |
| 5,239,206 | 8/1993 | Yanai | 327/202 |
| 5,243,703 | 9/1993 | Farmwald et al. | 713/400 |
| 5,254,883 | 10/1993 | Horowitz et al. | 326/30 |
| 5,274,276 | 12/1993 | Casper et al. | 326/21 |
| 5,276,642 | 1/1994 | Lee | 365/189.04 |
| 5,278,460 | 1/1994 | Casper | 327/546 |
| 5,281,865 | 1/1994 | Yamashita et al. | 327/208 |
| 5,311,481 | 5/1994 | Casper et al. | 365/230.06 |
| 5,321,368 | 6/1994 | Hoelzle | 327/218 |
| 5,347,177 | 9/1994 | Lipp | 326/30 |
| 5,347,179 | 9/1994 | Casper et al. | 326/122 |
| 5,349,247 | 9/1994 | Hush et al. | 326/88 |
| 5,355,391 | 10/1994 | Horowitz et al. | 375/36 |
| 5,361,002 | 11/1994 | Casper | 327/530 |
| 5,367,205 | 11/1994 | Powell | 326/27 |
| 5,400,283 | 3/1995 | Raad | 365/203 |
| 5,428,311 | 6/1995 | McClure | 327/276 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,451,898 | 9/1995 | Johnson | 327/53 |
| 5,457,407 | 10/1995 | Shu et al. | 326/30 |
| 5,473,575 | 12/1995 | Farmwald et al. | 365/230.06 |
| 5,485,490 | 1/1996 | Leung et al. | 375/371 |
| 5,488,321 | 1/1996 | Johnson | 327/66 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farnwald et al. | 395/309 |
| 5,568,077 | 10/1996 | Sato et al. | 327/199 |
| 5,574,698 | 11/1996 | Raad | 365/230.06 |
| 5,576,645 | 11/1996 | Farwell | 327/94 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,602,494 | 2/1997 | Sundstrom | 326/39 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,644,252 | 7/1997 | Watarai | 326/27 |
| 5,661,416 | 8/1997 | Takada et al. | 326/86 |
| 5,668,763 | 9/1997 | Sher et al. | 326/34 |
| 5,694,065 | 12/1997 | Hamasaki et al. | 327/108 |
| 5,719,509 | 2/1998 | Chan | 326/87 |
| 5,838,177 | 11/1998 | Keeth | 326/87 |

FOREIGN PATENT DOCUMENTS

| | | | |
|---|---|---|---|
| 4-135311 | 8/1992 | Japan | H03K 5/13 |
| 5-136664 | 1/1993 | Japan | H03K 5/13 |
| 05282868 | 10/1993 | Japan . | |
| 6-282817 | 10/1994 | Japan . | |
| 06326590 | 11/1994 | Japan . | |
| 96/10866 | 4/1996 | WIPO . | |

OTHER PUBLICATIONS

Taguchi, et al., "A 40–ns 64–Mb DRAM with 64–b Parallel Data Bus Architecture", *IEEE J. Solid–State Circuits*, 26, 1493–1497, (Nov. 1991).

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc. New York, NY, pp. 1–56.

ADJUSTABLE OUTPUT DRIVER CIRCUIT HAVING PARALLEL PULL-UP AND PULL-DOWN ELEMENTS

This application is a continuation of U.S. Ser. No. 08/779,344 filed Jan. 6, 1997, now U.S. Pat. No. 5,838,177.

TECHNICAL FIELD OF THE INVENTION

This invention relates generally to integrated circuits and particularly to data output drivers for high speed data transmission.

BACKGROUND OF THE INVENTION

Integrated circuits typically include a number of input/output pins which are used for communication with additional circuitry. For example, an integrated memory device such as a dynamic random access memory (DRAM) includes both control inputs for receiving memory operation control signals, and data pins for bi-directional data communication with an external system or processor.

The data transmission rate of modern integrated circuits is primarily limited by internal circuitry operating speeds. Communication networks can typically transmit signals between circuitry at a rate that is faster than the capacity of some integrated circuits. To address the need for faster circuits, a group of integrated circuits can be combined on a common bus. In this configuration, each integrated circuit operates in a coordinated manner with the other integrated circuits to share data that is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory processes received data, another memory receives new data. By providing an appropriate number of memory devices and an efficient control system, very high speed data transmissions can be achieved.

As the transmission rate of the data communication signals continues to increase, new circuitry and methods are needed to accurately transmit data from each integrated circuit. One proposed solution is a bus driver described in U.S. Pat. No. 5,254,883. This bus driver circuit uses parallel output transistors that single-endedly couple the bus to a power supply. The output transistors are fabricated in different sizes and selectively activated to control the bus current. This approach is directed towards accurate bus current control to establish the bus voltage at an accurate logic voltage level. However, the approach lacks control over the transition of the bus voltage between logic voltage levels.

For the reasons stated above, and for other reasons stated below which will become apparent to those skilled in the art upon reading and understanding the present specification, there is a need in the art for a high speed output driver circuit which is fully adjustable, and offers control of the transition of the bus voltage between logic voltage levels.

SUMMARY OF THE INVENTION

The above mentioned problems with output driver circuits and other problems are addressed by the present invention and will be understood by reading and studying the following specification.

The present invention describes an output driver circuit comprising output transistors having a control terminal, and electrically coupling an output node to a first voltage, and a control circuit coupled to the control terminal of the output transistors. The control circuit sequentially turns on or off the output transistors in response to a transition of an input signal received by the control circuit. The control circuit also comprises forcing circuitry for selectively forcing a signal on an internal control circuit node to the first or a second voltage.

In another embodiment, a synchronous memory device is described. The memory device comprises an array of memory cells for storing data received on a data communication line, and an output driver circuit having an output node electrically coupled to the data communication line. The output driver provides data read from the array of memory cells. The output driver circuit comprises first output transistors for electrically coupling a first voltage to an output node, second output transistors for electrically coupling the output node to a second voltage, and a control circuit. The control circuit is coupled to a control terminal of each of the first and second output transistors for sequentially turning on or off the output transistors in response to respective transitions in first and second input signals received by the control circuit. The memory further comprises matching circuitry for matching an output load at the control terminal of each output transistor.

The present invention is particularly useful for high speed data communications, such as in a synchronous memory including a dynamic random access memory (DRAM).

BRIEF DESCRIPTION OF THE DRAWINGS

In the drawings, like numerals describe substantially similar components throughout the several views.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention is applicable to integrated circuit devices. In particular, the present invention can be embodied as an integrated circuit memory device. These memory devices include, but are not limited to, synchronous memories, dynamic random access memories (DRAM, or SDRAM), and static memories (SRAM).

Figure 1:
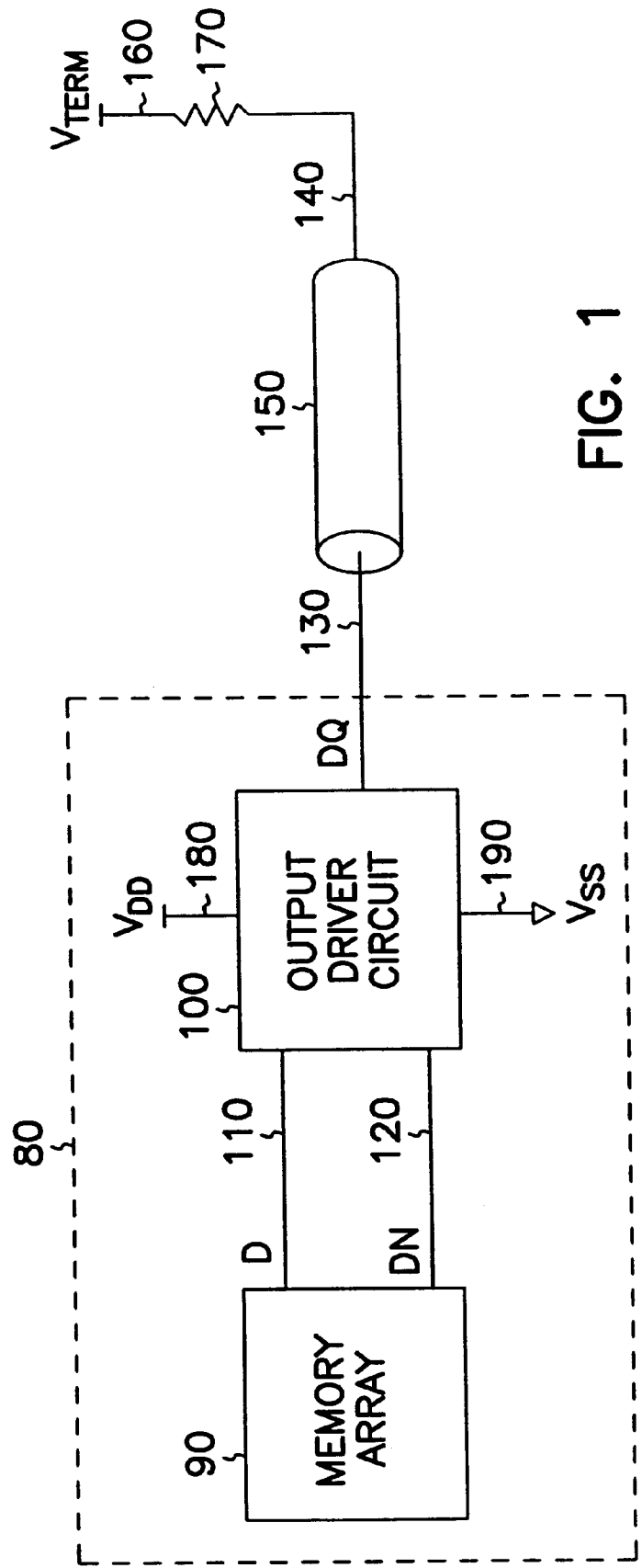
FIG. 1 is a schematic illustration of one embodiment of the present invention.

FIG. 1 illustrates one embodiment of the present invention and the environment in which it is used. In FIG. 1, a memory device 80 is illustrated which includes a memory array 90. It will be understood by those skilled in the art that memory 80 has been simplified to focus on the feature particularly relevant to understanding the present invention. Necessary control and communication circuitry for the memory, therefore, have not been shown, but are known to those skilled in the art. Memory array 90 includes memory cells and read circuitry for reading data stored in the memory cells. Output driver circuit 100 receives the data read from memory array 90 as first input signal D at node 110 and its binary complement, second input signal DN, at node 120, and provides in response thereto an output signal DQ at output node 130. Output node 130 is electrically coupled to receiving node 140 through data communication line 150, which may include distributed interconnect, pad, and other resistance and capacitance both on and off the integrated circuit chip. Output node 130 is also electrically coupled to a termination power supply voltage, $V_{term}$, at termination node 160 through termination resistor 170. First and second power supply voltages, such as $V_{DD}$ at node 180 and $V_{SS}$ at node 190 are provided to output driver circuit 100. $V_{term}$ is typically a voltage approximately midway between $V_{DD}$ and $V_{SS}$.

Figure 2:
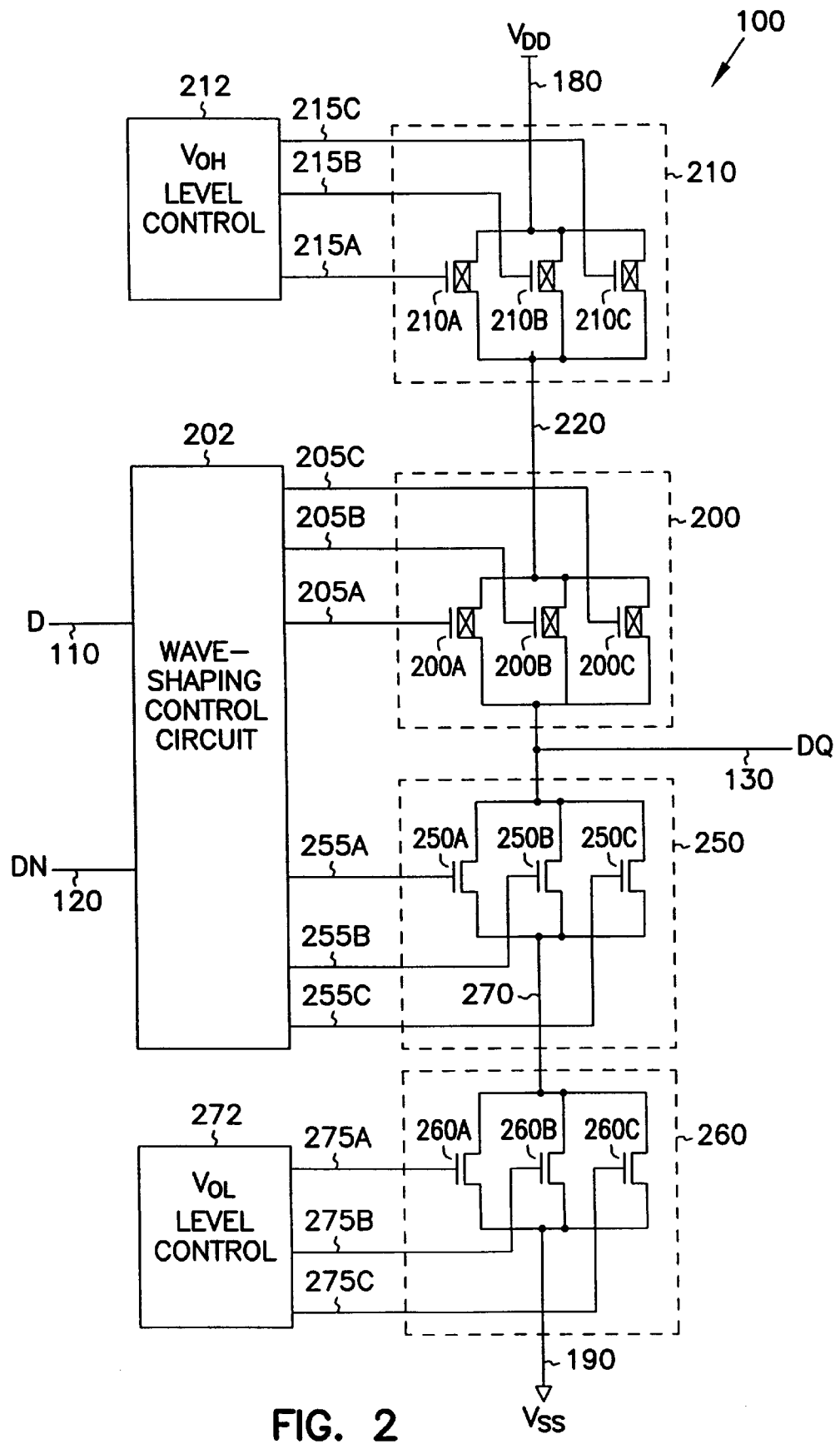
FIG. 2 is a more detailed schematic of one embodiment of the output driver circuit of FIG. 1.

FIG. 2 is a schematic illustration that illustrates one embodiment of the output driver circuit 100 in more detail. In FIG. 2, a first plurality 200 of output transistors, such as P-type transistors 200A–C, have their drain terminals coupled together and to output node 130. Wave-shaping control circuit 202 provides independent control terminal signals at nodes 205A–C to the respective gate terminals of P-type transistors 200A–C. The source terminals of P-type transistors 200A–C are coupled together and to $V_{DD}$ through a first impedance 210.

In one embodiment, first impedance 210 comprises active devices such as P-type transistors 210A–C, having their drain terminals coupled together and to the source terminals at node 220 of each of P-type transistors 200A–C in the first plurality 200 of output transistors. P-type transistors 210A–C have their source terminals coupled together and to $V_{DD}$ at node 180. $V_{OH}$ level control circuit 212 provides independent control terminal signals at nodes 215A–C to the respective gate terminals of P-type transistors 210A–C to programmably control first impedance 210 by varying how many and which of P-type transistors 210A–C are turned on. Those of P-type transistors 210A–C that are turned on contribute to the effective value of the impedance between node 220 and $V_{DD}$ at node 180. P-type transistors 210A–C may have varying width/length aspect ratios, or may each comprise different multiples of instances of parallel-connected P-type transistors of the same width/length aspect ratio, or may otherwise be designed for optimizing the effective value of the impedance between node 220 and $V_{DD}$ at node 180 by permuting which of P-type transistors 210A–C are turned on.

Impedance 210 forms a resistive divider with termination resistor 170, the impedance values of which determine the binary high logic voltage level, $V_{OH}$, at output node 130. $V_{OH}$ level control circuit 212, by controlling which of P-type transistors 210A–C are turned on, controls the value of impedance 210 and, in turn, controls the value of $V_{OH}$.

A second plurality 250 of output transistors, such as N-type transistors 250A–C, have their drain terminals coupled together and to output node 130. Wave-shaping control circuit 202 provides independent control terminal signals at nodes 255A–C to the respective gate terminals of N-type transistors 250A–C. The source terminals of N-type transistors 250A–C are coupled together and to $V_{SS}$ through a second impedance 260.

In one embodiment, second impedance 260 comprises active devices such as N-type transistors 260A–C, having their drain terminals coupled together and to the source terminals at node 270 of each of N-type transistors 250A–C in the second plurality 250 of output transistors. N-type transistors 260A–C have their source terminals coupled together and to $V_{SS}$ at node 190. $V_{OL}$ level control circuit 272 provides independent control terminal signals at nodes 275A–C to the respective gate terminals of N-type transistors 260A–C to programmably control impedance 260 by varying how many and which of N-type transistors 260A–C are turned on. Those of N-type transistors 260A–C that are turned on contribute to the effective impedance between node 270 and $V_{SS}$ at node 190. N-type transistors 260A–C may have varying width/length aspect ratios, or may each comprise different multiples of instances of parallel-connected N-type transistors of the same width/length aspect ratio, or may otherwise be designed for optimizing the effective impedance between node 270 and VSS at node 190 by permuting which of N-type transistors 260A–C are turned on.

Impedance 260 forms a resistive divider with termination resistor 170, the impedance values of which determine the binary low logic voltage level, $V_{OL}$, at output node 130. $V_{OL}$ level control circuit 272, by controlling which of N-type transistors 260A–C are turned on, controls the value of impedance 260 and, in turn, controls the value of $V_{OL}$.

In the above description first plurality 200 of output transistors, second plurality 250 of output transistors, first impedance 210, and second impedance 260 have each been described, for clarity of illustration, as comprising three field-effect transistors. However, it is understood that the exact number of said transistors may be selected according to individual design constraints without departing from the scope and spirit of the present invention.

Figure 3:
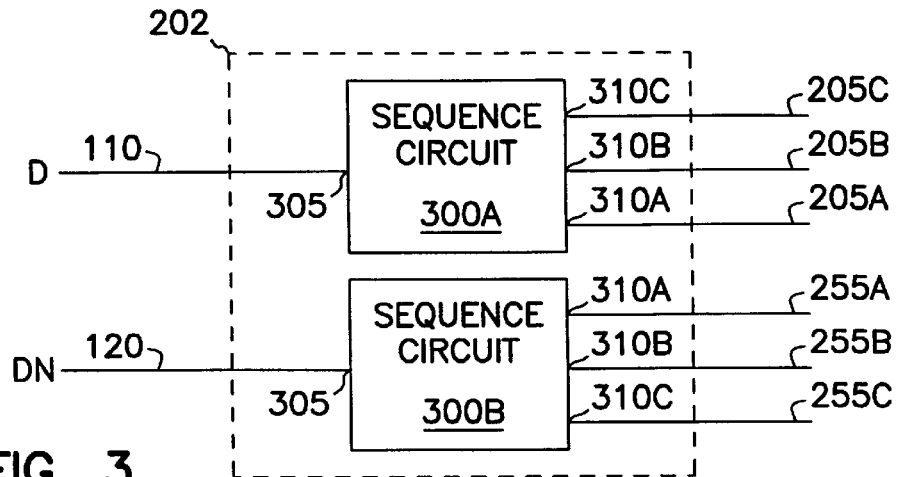
FIG. 3 is a schematic of wave-shaping control circuitry of FIG. 2 in more detail.

FIG. 3 is a schematic illustration that illustrates wave-shaping control circuit 202 in more detail. Wave-shaping circuit 202 includes sequence circuits 300A–B receiving at respective first and second input signals D and DN at input terminals 305 that are electrically coupled to respective nodes 110 and 120. Sequence circuits 300A–B respectively provide, in response thereto, sequentially time-delayed control terminal signals at output terminals 310A–C that are electrically coupled to respective nodes 205A–C and 255A–C. The sequentially time-delayed control terminal signals effect coupling of output node 130 to respective $V_{DD}$ at node 180 and $V_{SS}$ at node 190 through respective first plurality 200 and second plurality 250 of output transistors. As will be described below, by providing sequentially delayed control terminal signals to the output transistors, sequence circuits 300A–B provide control over the slew rate of the voltage at output node 130, with the slew rate control being substantially independent of the $V_{OH}$ and $V_{OL}$ level control provided by first and second impedances 210 and 260, respectively.

Figure 4:
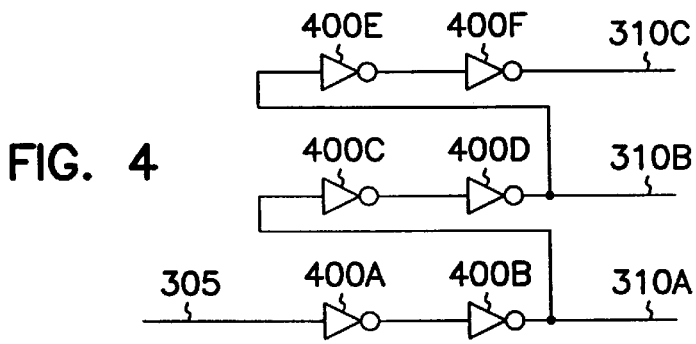
FIG. 4 is a schematic of one embodiment of sequence circuits of FIG. 3.

FIG. 4 is a schematic illustration that illustrates one embodiment of each of sequence circuits 300A–B in more detail. FIG. 4 includes a string of series-cascaded inverters 400A–F, for receiving an input signal at input terminal 305, and providing a number of sequentially delayed signals in response thereto at output terminals 310A–C. In this embodiment, the delay between the signal transition at the input terminal 305 and the signal transition at each of the output terminals 310A–C is determined by the inverter delays of the corresponding number of inverters therebetween, including interconnect capacitance and load capacitance of subsequent inverters and output transistors.

Figure 5:
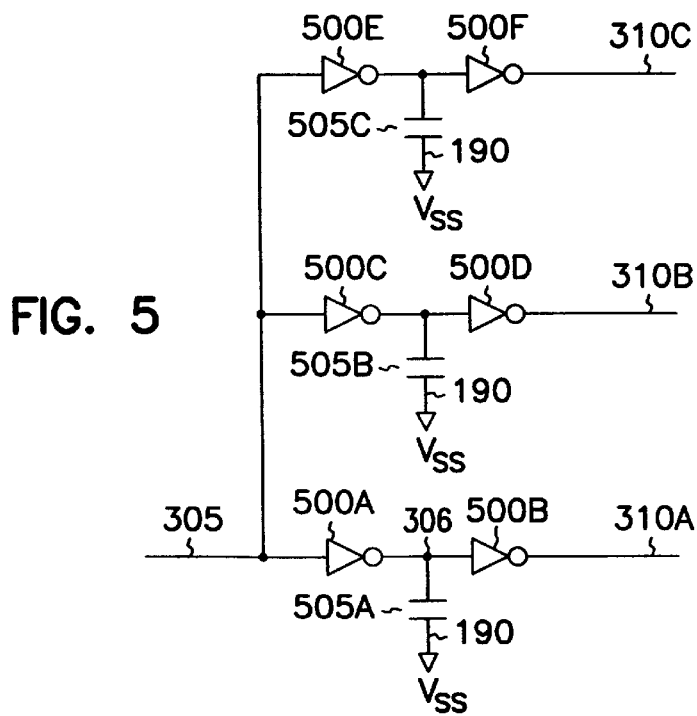
FIG. 5 is a schematic of another embodiment of sequence circuits of FIG. 3.

FIG. 5 is a schematic illustration that illustrates another embodiment of each of sequence circuits 300A–B in more detail. FIG. 5 includes pairs of series-cascaded inverters 500A–F. Each pair of inverters, such as pairs 500A–B, 500C–D, 500E–F, receives the input signal at input terminal 305 and provide a sequentially delayed signal in response thereto at respective output terminals 310A–C. Each pair of inverters, such as pairs 500A–B, 500C–D, 500E–F, has a capacitance interposed therebetween, such as respective capacitances 505A–C. The capacitances 505A–C are preferably trimmably adjustable, such as by fuse or other programmable elements, for tailoring the delays between the signal transition at the input terminal 305 and the signal transition at each of the output terminals 310A–C. The capacitances are trimmned so that each delay path is different to provide a number of sequentially delayed signals at output terminals 310A–C.

Figure 6:
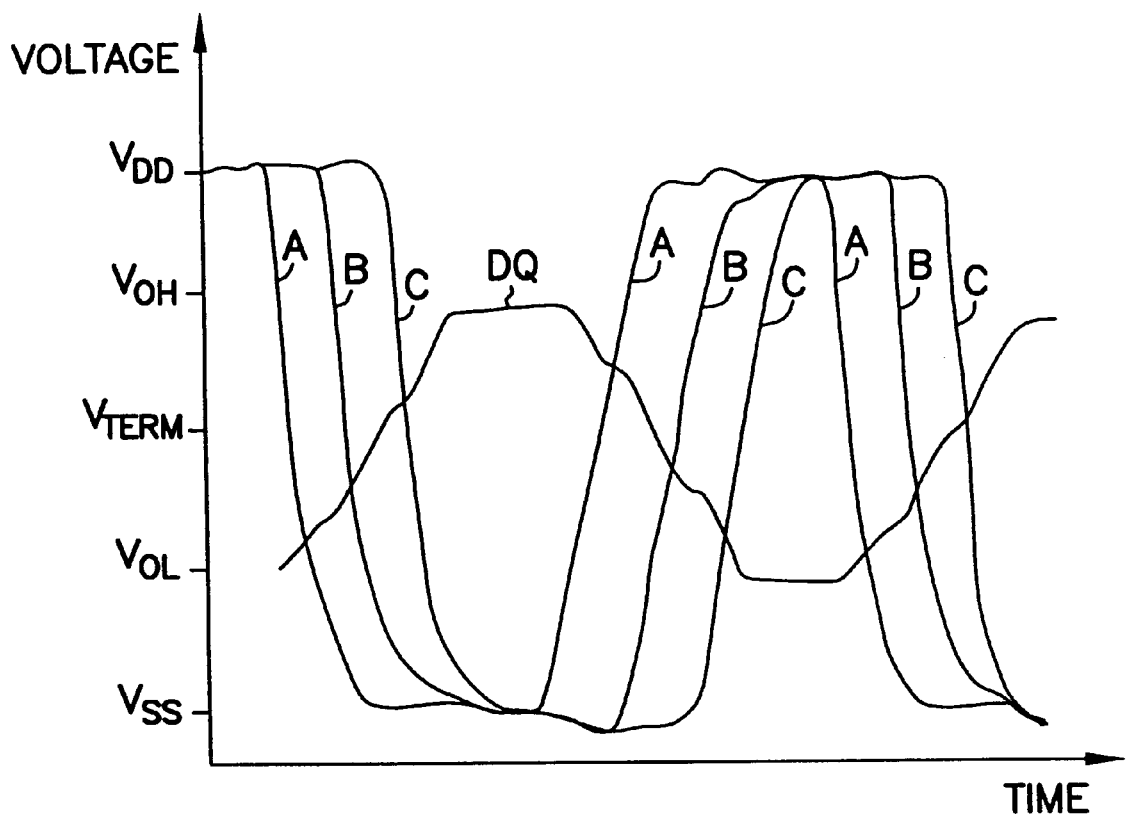
FIG. 6 is a graph illustrating the voltage vs. time waveforms of the output driver circuit of FIG. 2.

FIG. 6 is a graph illustrating the voltage vs. time waveforms of the output driver circuit 100. In FIG. 6, signal A represents the voltage waveform at nodes 205A and 255A, signal B represents the voltage waveform at nodes 205B and 255B, and signal C represents the voltage waveform at nodes 205C and 255C, and signal DQ represents the voltage waveform at node 130. Thus, FIG. 6 illustrates the slew-rate tailoring of transitions in the DQ signal in response to the sequentially delayed control terminal signals provided by wave-shaping control circuit 202. FIG. 6 also illustrates the reduced signal swing, i.e. $V_{OH}$ and $V_{OL}$ voltage levels, provided by impedances 210 and 260 in conjunction with terminating resistor 170. Providing an odd number of output transistors in each of the first plurality 200 and second plurality 250 of output transistors, avoids a plateau in signal DQ at the $V_{term}$ voltage.

Figure 7:
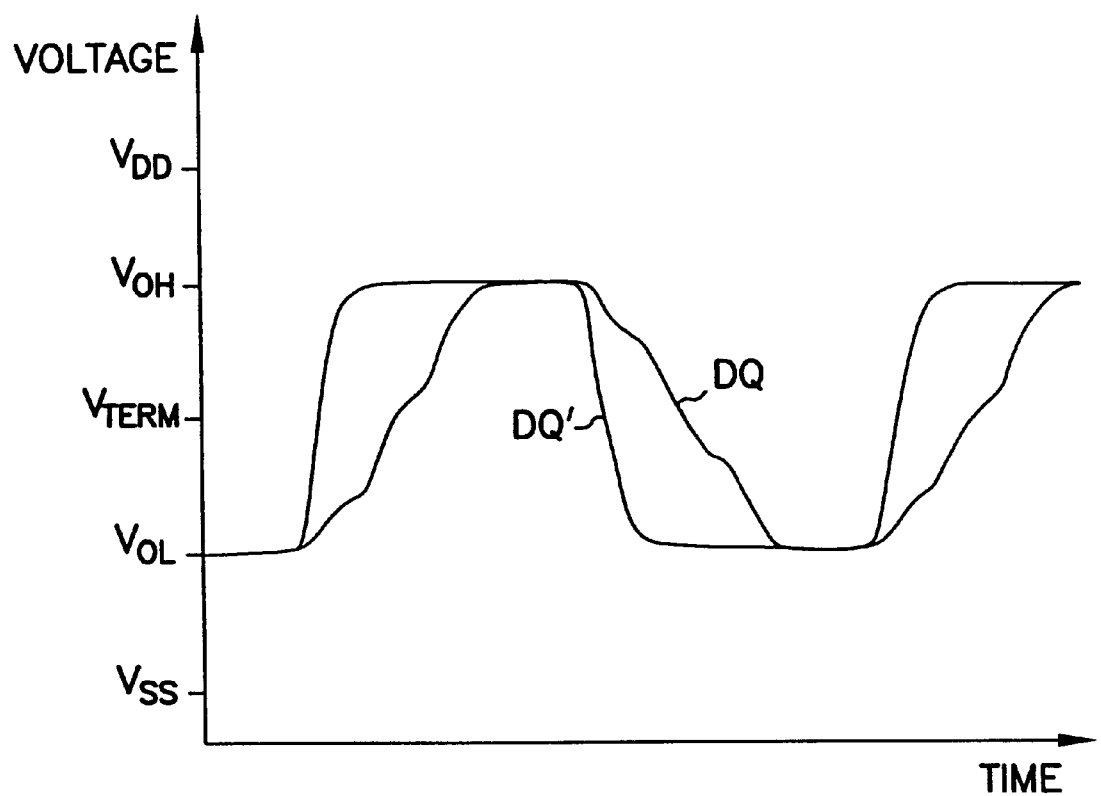
FIG. 7 is a graph illustrating the voltage vs. time waveform of a DQ voltage of the output driver circuit of FIG. 2 and a DQ' voltage of a typical output driver circuit.

FIG. 7 is a graph illustrating the voltage vs. time waveform of the voltage DQ at output node 130 of output driver circuit 100 with respect to a voltage DQ' of a conventional output driver circuit without the slew-rate wave-shaping provided by the present invention. As seen in FIG. 7, the slew rate of voltage transitions of the voltage DQ according to the output driver circuit 100 of the present invention may be controlled more precisely than the voltage transitions of the voltage DQ' according to the conventional output driver circuit.

FIG. 7 illustrates the case wherein each of the output transistors in the first plurality 200 and second plurality 250 are equally weighted; their effective width/length aspect ratios are substantially identical. As seen in FIG. 7, this results in an approximately linear slew rate wave-shaping.

Figure 8:
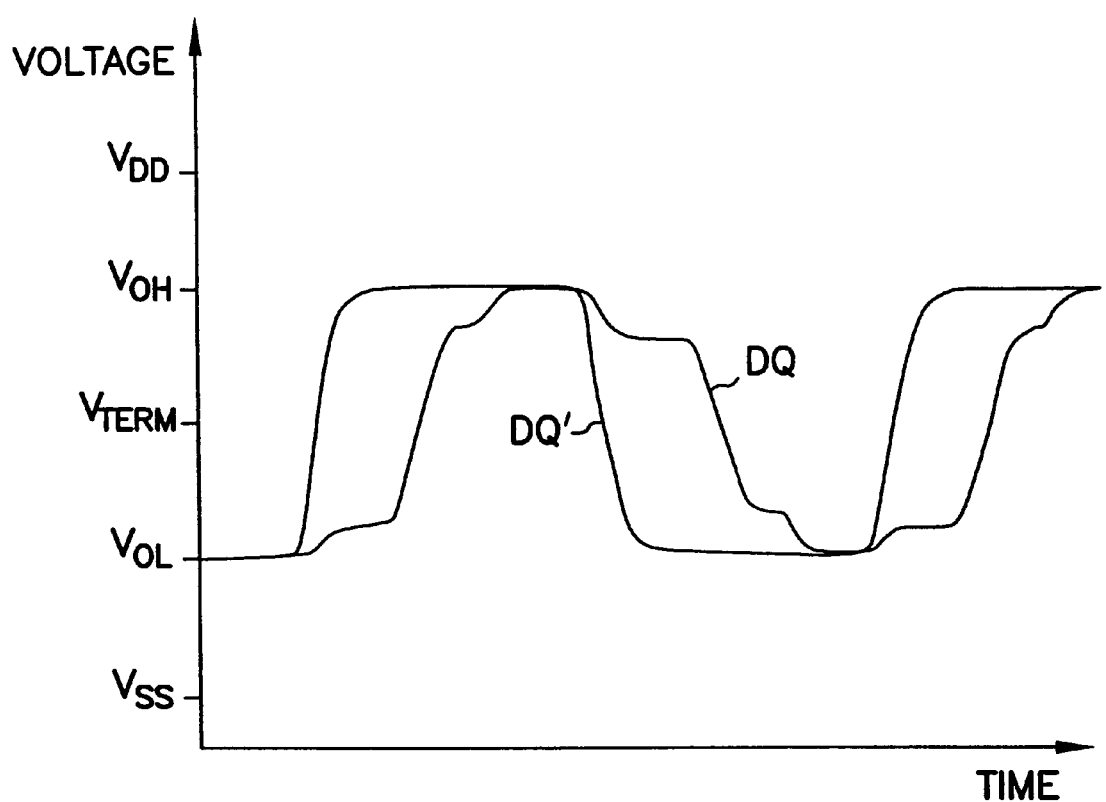
FIG. 8 is a graph of waveforms resulting from a first unequal weighting of the output transistors

FIG. 8 is a graph, similar to FIG. 7, in which the output transistors in the first plurality 200 and second plurality 250 of output transistors are not equally weighted. FIG. 8 illustrates the case where the intermediate transistors, such as 200B and 250B, have effective width/length aspect ratios that are larger than the effective width/length aspect ratios of the end transistors, such as 200A, 200C, 250A, and 250C. In this embodiment, the slew rate of the voltage DQ at output node 130 is faster near the midpoint between the $V_{OH}$ and $V_{OL}$ levels.

Figure 9:
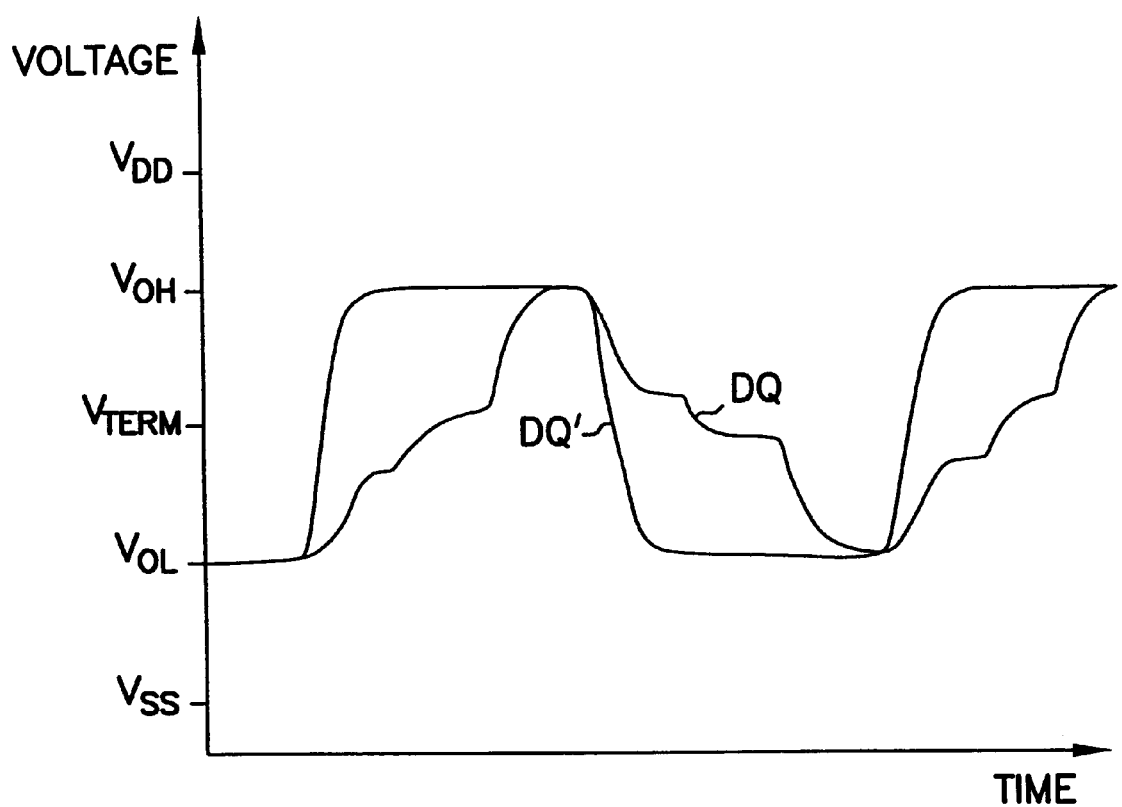
FIG. 9 is a graph of waveforms resulting from a second unequal weighting of the output transistors.

FIG. 9 is a graph, similar to FIG. 7, in which the output transistors in the first plurality 200 and second plurality 250 of output transistors are not equally weighted. FIG. 9 illustrates the case where the intermediate transistors, such as 200B and 250B, have effective width/length aspect ratios that are smaller than the effective width/length aspect ratios of the end transistors, such as 200A, 200C, 250A, and 250C. In this embodiment, the slew rate of the voltage DQ at output node 130 is faster near the each of the $V_{OH}$ and $V_{OL}$ levels than near the midpoint between these two levels.

FIGS. 7–9 illustrate different approaches to weighting output transistors in each of the first plurality 200 and second plurality 250 of output transistors. Ones of the first plurality 200 of output transistors could also be weighted differently from ones of the second plurality 250 of output transistors; many combinations are possible in order to obtain the desired wave-shaping of the voltage DQ at output node 130.

Figure 10:
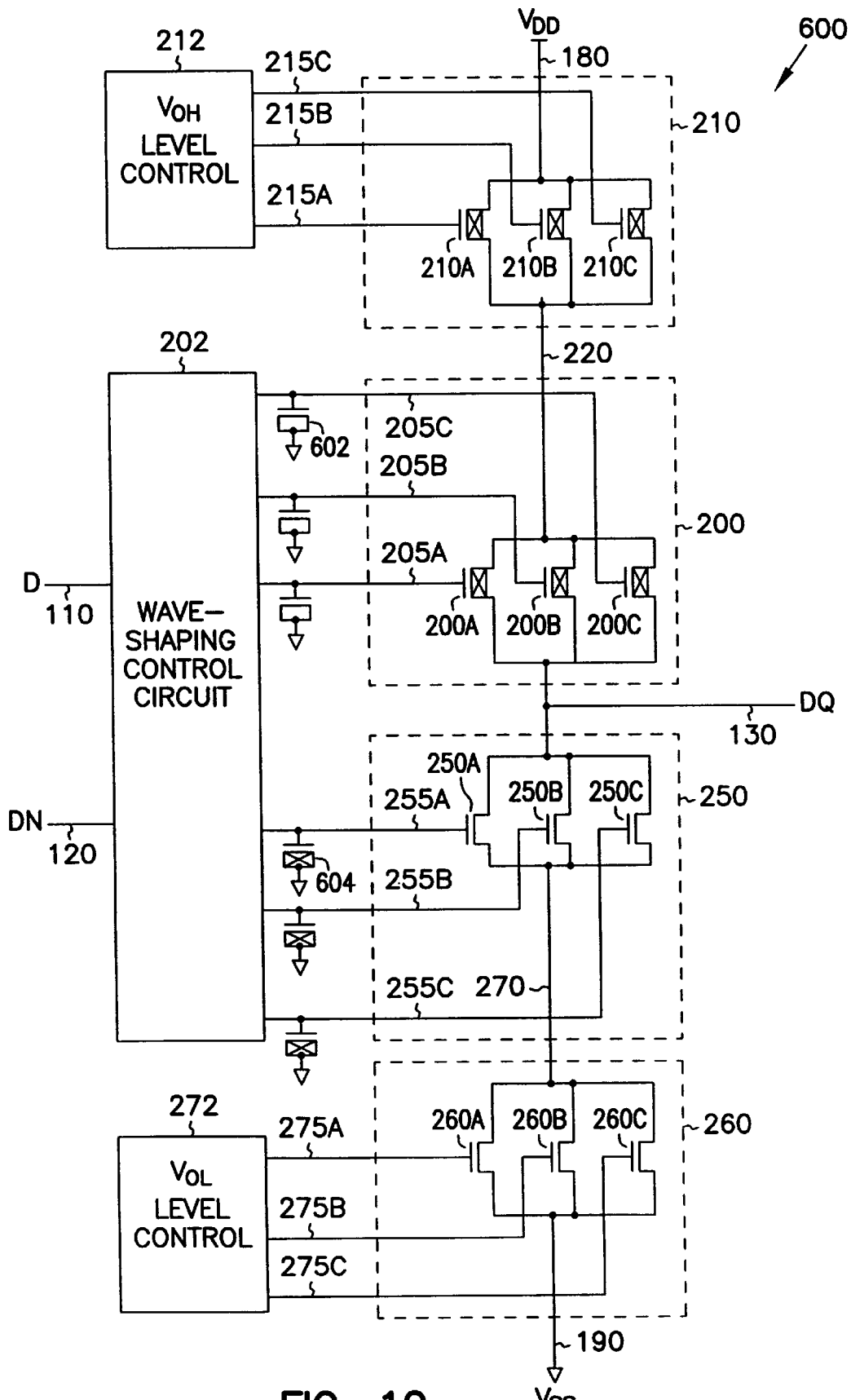
FIG. 10 is a more detailed schematic of another embodiment of the output driver circuit of FIG. 1.

The output driver circuit 100 described above can suffer from rise and fall time imbalance. That is, Nodes 205A–C and nodes 255A–C of FIG. 2 could suffer from finite rise and fall time imbalance because the respective node loads are not equivalent. The load difference is primarily due to nodes 205A–C driving P-type transistors and nodes 255A–C driving N-type transistors. In addition, the size of the N-type and P-type transistors are typically not equivalent. To avoid rise and fall time imbalances, a P-type transistor fabricated as capacitor 604 is coupled between nodes 255A–C and ground, and an N-type transistor fabricated as capacitor 602 is coupled between nodes 205A–C and ground, as illustrated in FIG. 10. The load, therefore, for each stage of the output buffer is matched. Thus, matching circuitry for matching the output load is provided in one embodiment using capacitor connected transistors. Either of the sequence circuits described in FIGS. 4 and 5 can be used in the wave-shaping control circuit 202 of output driver circuit 600. However, an alternate sequence circuit can be used to reduce frequency dependancy, as explained below.

Figure 11:
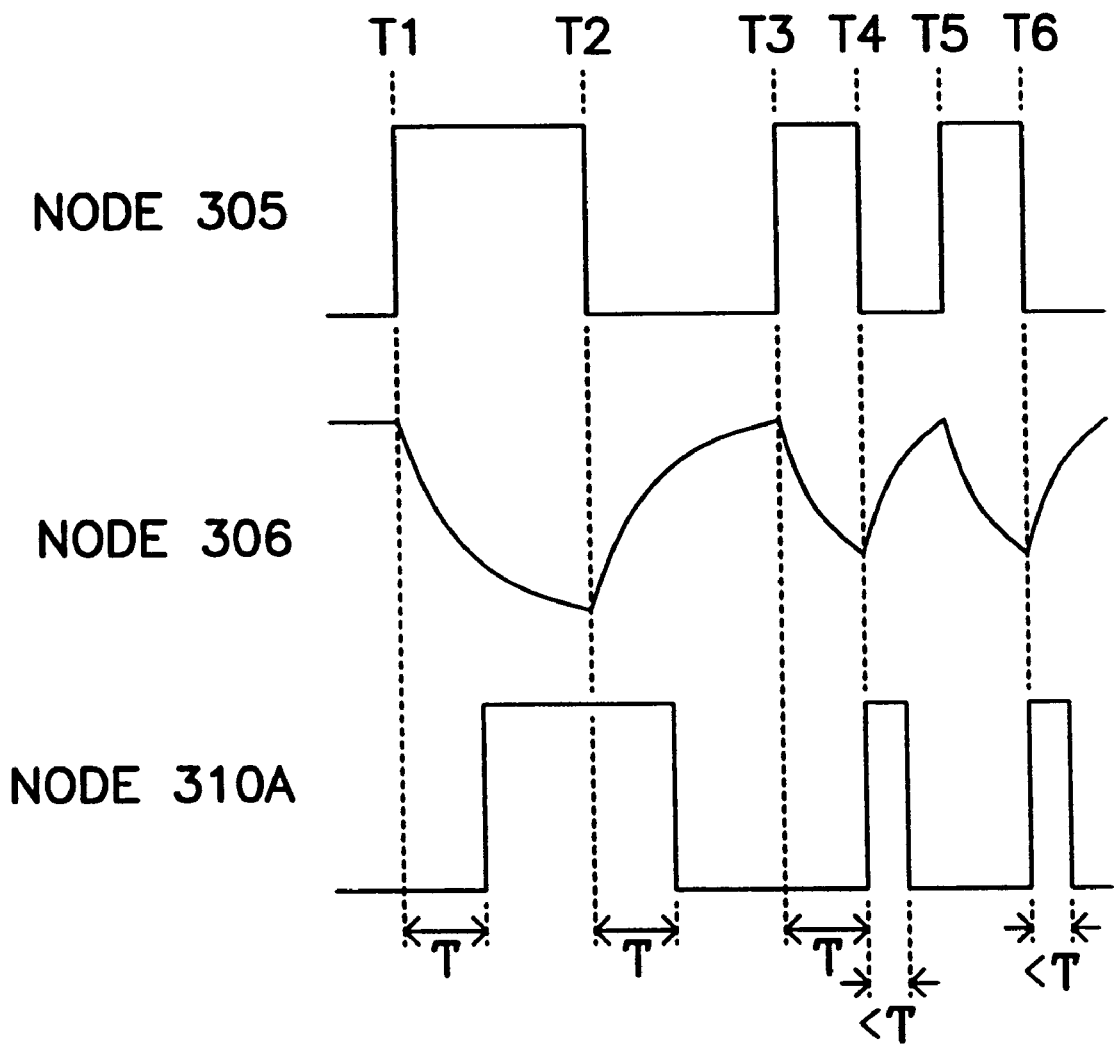
FIG. 11 is a timing diagram of the circuit of FIG. 5.

FIG. 11 illustrates the operation of one delay stage of cascaded inverters 500A and 500B, of FIG. 5. The diagram illustrates the voltage at nodes 305, 306 and 310A. It will be appreciated that as the input signal (node 305) increases in frequency, node 306 does not reach full power rail. Thus, the output signal (node 310A) will have data dependent delays. That is, the rising edge of node 301A is delayed from the rising edge of node 305 by time T, but the delay between the falling edge of node 310A and the falling edge of node 305 will be less than time T at higher frequencies.

Figure 12:
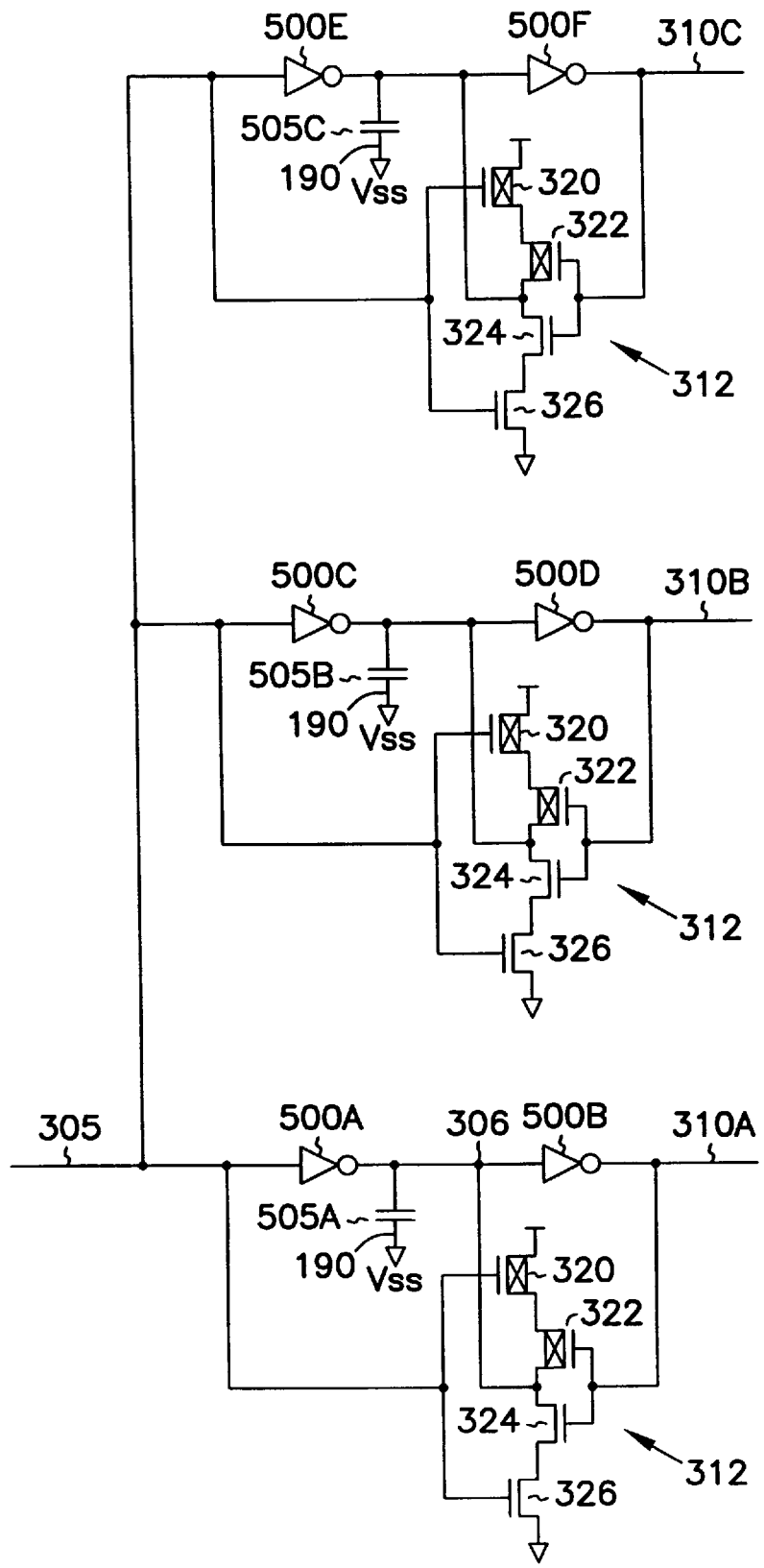
FIG. 12 is a schematic of another embodiment of sequence circuits of FIGS. 3 or 10.
Figure 13:
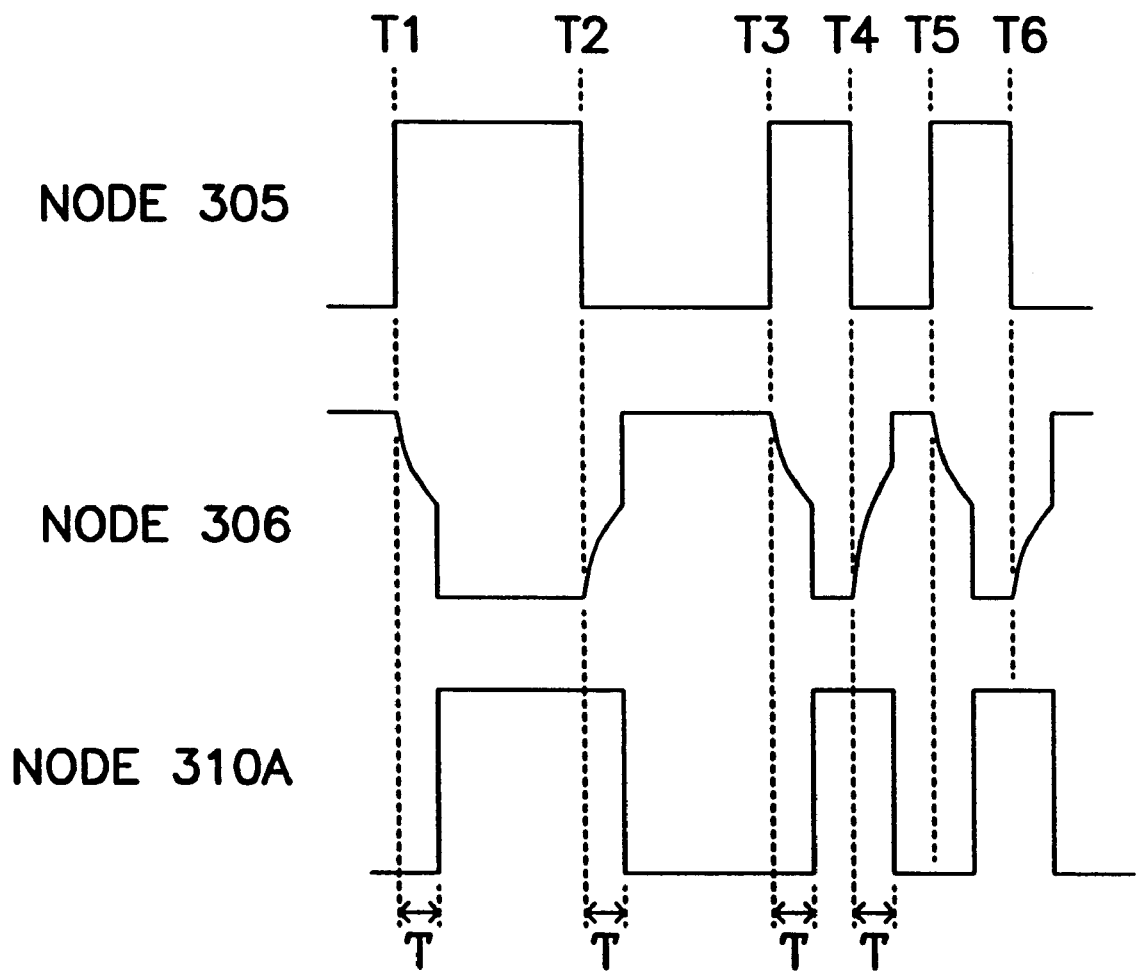
FIG. 13 is a timing diagram of the circuit of FIG. 12.

To reduce the frequency dependance of the delay stage, feed forward and feed back compensation can be added, as shown in FIG. 12. It will be understood that in this embodiment each delay stage of the circuit of FIG. 5 which provide terminal signals 205 and 255 will have forcing circuitry 312. The forcing circuitry comprises P-type transistors 320 and 322, and N-type transistors 324 and 326. In operation, when the input (node 305) and output (node 310A) transition from a high logic state to low logic state, transistors 320 and 322 are activated and pull node 306 to $V_{DD}$. When the input (node 305) and output (node 310A) transition from a low logic state to high logic state, transistors 324 and 326 are activated and pull node 306 to $V_{SS}$. Node 306, therefore, reaches full power rails during each cycle. As shown in FIG. 13, frequency dependance of the time delay between the input and output signals of the delay stage is reduced. As such, the driver circuit can operate over a greater frequency range without degraded performance.

Figure 14:
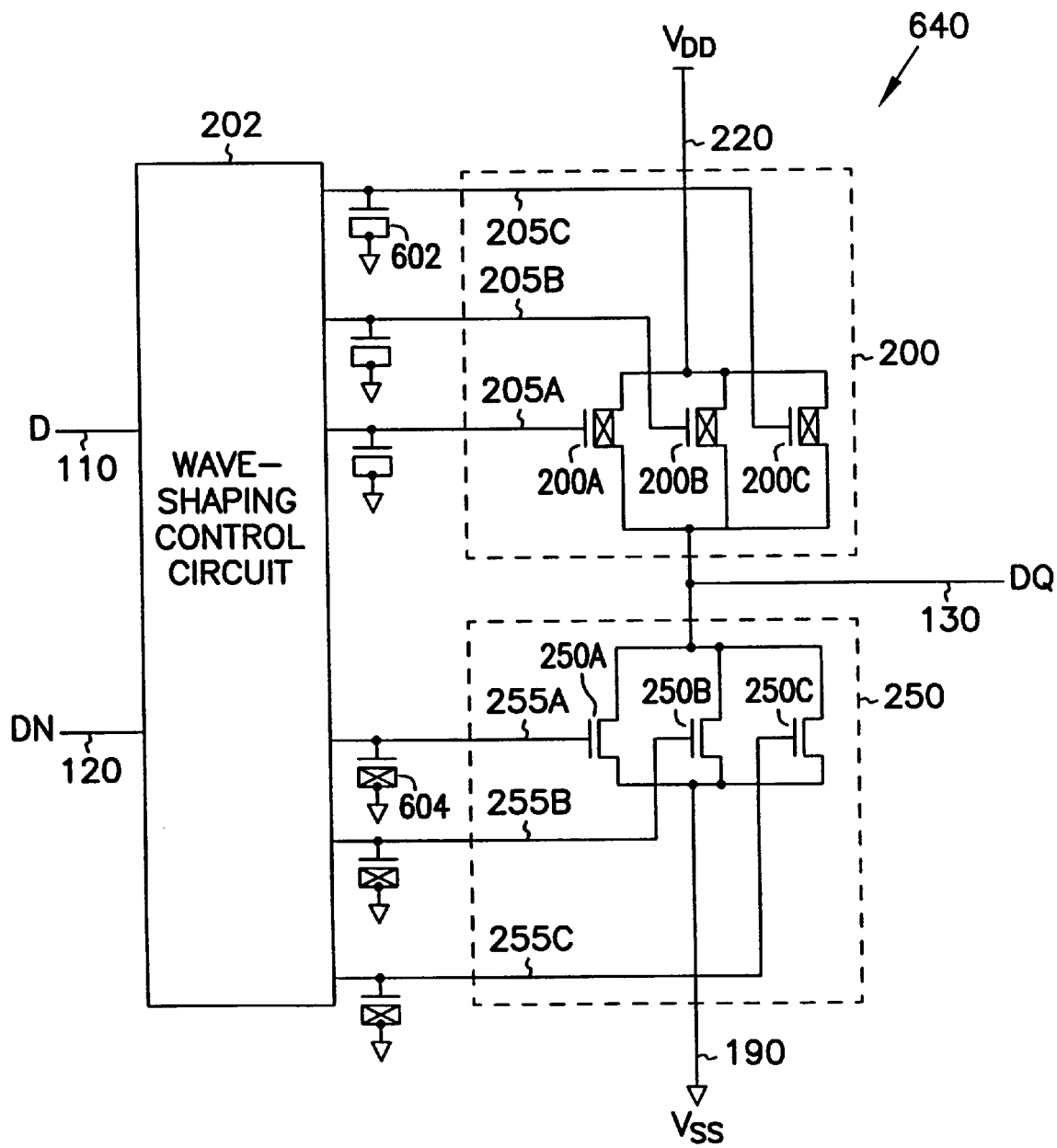
FIG. 14 is a schematic of an alternate embodiment of the output driver circuit.

FIG. 14 is a schematic illustration that illustrates an alternate output driver circuit 640. In FIG. 14, the first and second impedances 210 and 260, respectively, and corresponding $V_{OH}$ and $V_{OL}$ level control circuits 212 and 272 of output driver circuit 600, are not present. This embodiment offers slew rate and other wave-shaping of the transitions in the voltage DQ at output node 130, but does not adjust the $V_{OH}$ and $V_{OL}$ output levels by controlling impedances. N-type capacitors 602 and P-type capacitors 604 are included to balance the load of each stage of the output driver.

Figure 15:
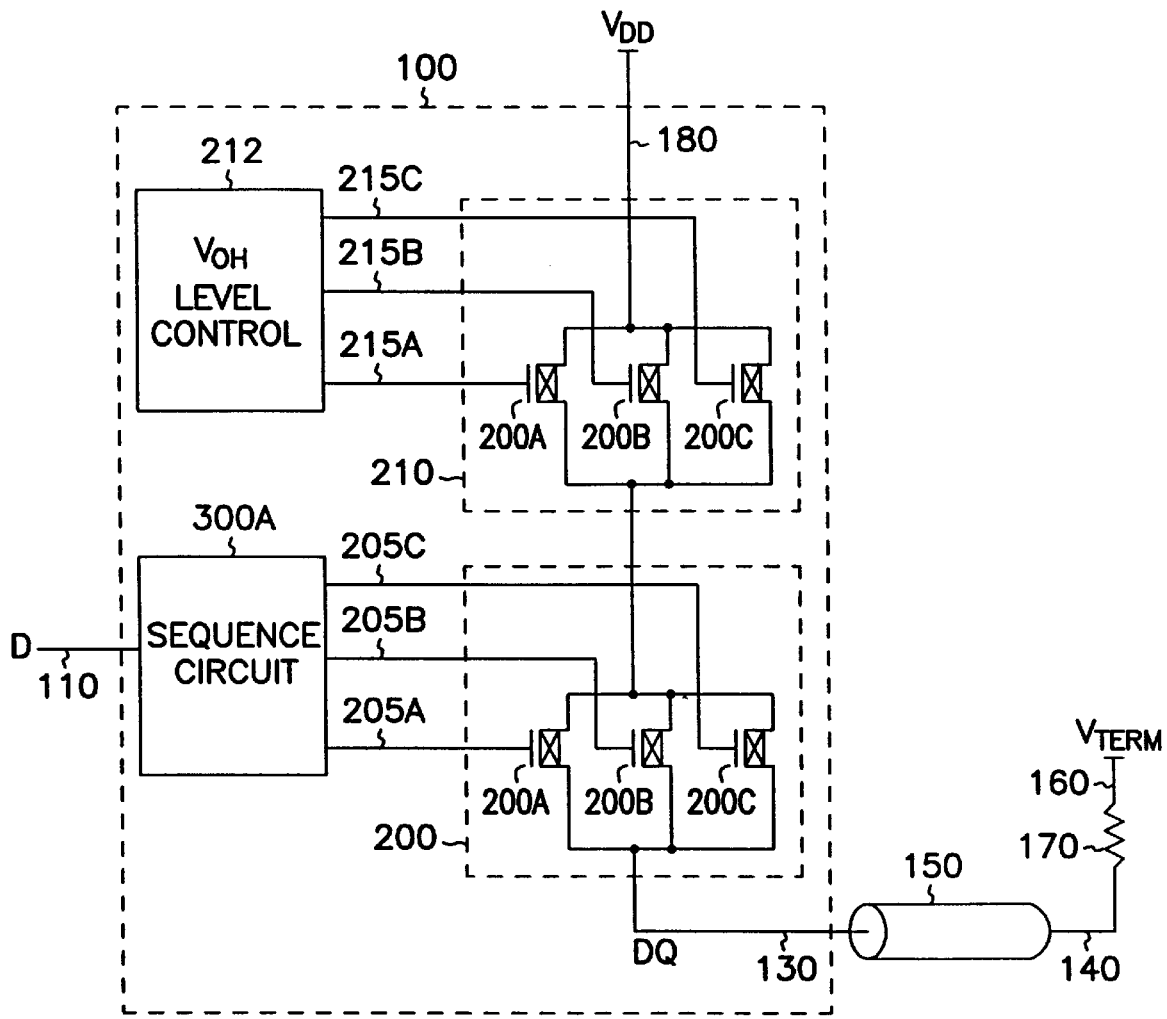
FIG. 15 is a schematic of an alternate embodiment of the output driver circuit.

FIG. 15 is a schematic illustration that illustrates a single-ended alternate embodiment of the output driver circuit 100. In FIG. 15, the second plurality 250 of output transistors and second impedance 260 are not present. This embodiment offers slew rate and $V_{OH}$ level control of the voltage DQ at output node 130; the $V_{OL}$ level is established at $V_{term}$ by the resistive connection through termination resistors 170 to the termination voltage at node 160. Capacitors 602 are not required for this single-ended embodiment.

Figure 16:
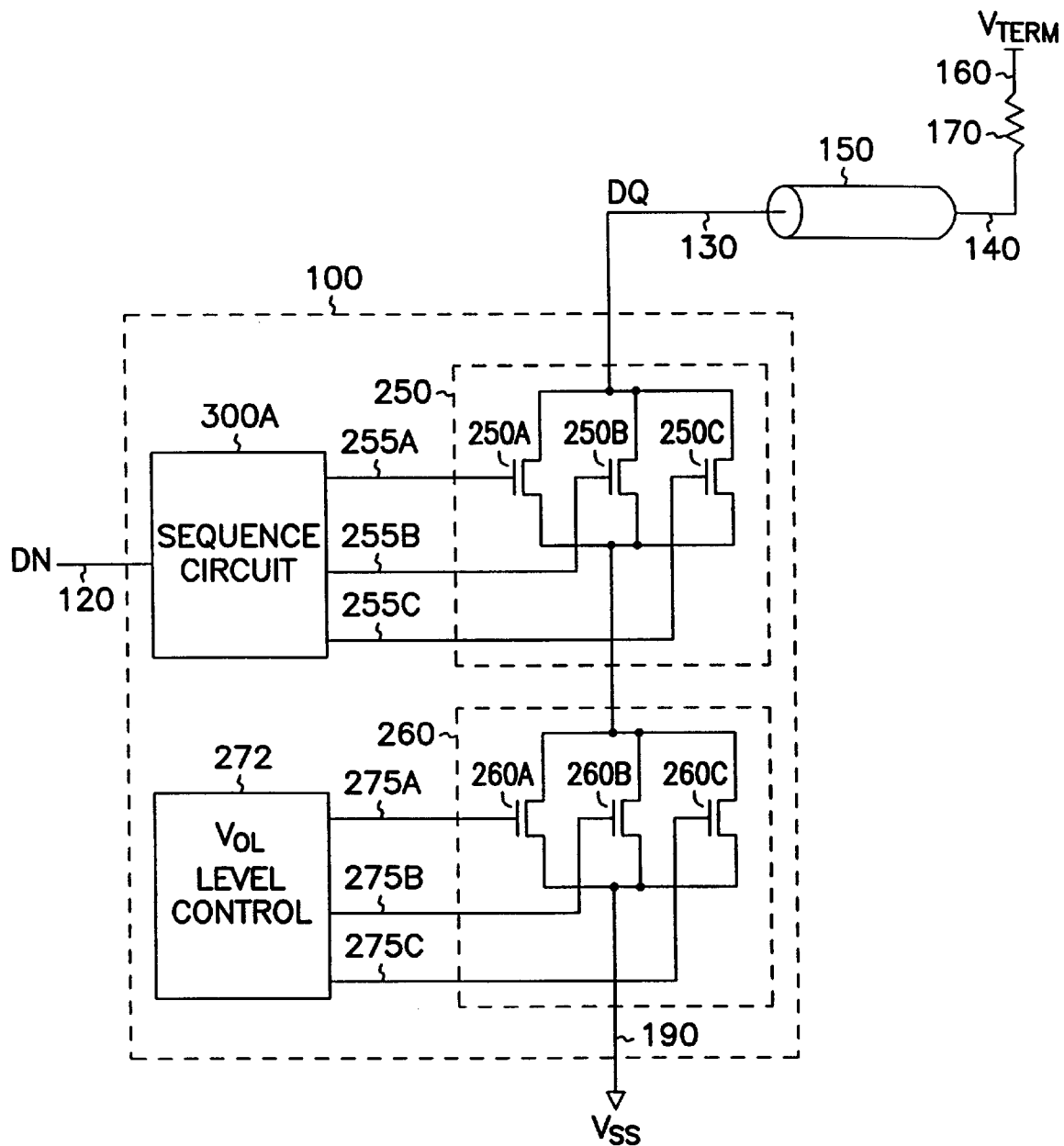
FIG. 16 is a schematic of an alternate embodiment of the output driver circuit.

FIG. 16 is a schematic illustration that illustrates another single-ended alternate embodiment of the output driver circuit 100. In FIG. 12, the first plurality 200 of output transistors and first impedance 210 are not present. This embodiment offers slew rate and $V_{OL}$ level control of the voltage DQ at output node 130; the $V_{OH}$ level is established at $V_{term}$ by the resistive connection through termination resistors 170 to the termination voltage at node 160. Again, because there only a single load, capacitors 604 are not required.

Thus the present invention includes method and apparatus of wave-shaping a signal, including logic voltage levels and a slew rate of a voltage transition therebetween. The present invention is particularly useful for high speed data communications, such as in a synchronous memory including a dynamic random access memory (DRAM).

Although specific embodiments have been illustrated and described herein, it will be appreciated by those of ordinary skill in the art that any arrangement which is calculated to achieve the same purpose may be substituted for the specific embodiment shown. This application is intended to cover any combinations, adaptations, or variations of the present invention. Therefore, it is manifestly intended that this invention be limited only by the claims and the equivalents thereof.

Conclusion

An output driver circuit has been described which offers wave-shaping and logic level adjustment for high speed data communications in a synchronous memory such as a synchronous dynamic random access memory (SDRAM). Level adjustment is obtained by resistive division between a termination resistor and controllable impedances between an output node and $V_{DD}$ and $V_{SS}$ power supplies. Wave-shaping functions include slew rate modification of the signal at the output node, by sequentially turning on or off output transistors in response to a transition in an input signal. Load compensating capacitors have been described for balancing the output loads and eliminating rise and fall time imbalances. Further, delay element stages have been described which include feed forward and feed back circuitry to reduce data dependant delays during high frequency operation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An output driver circuit, comprising:
    a first plurality of active load devices electrically coupled between an output node and a first voltage terminal, each active load device having a control terminal;
    a control circuit coupled to each of the control terminals of the active load devices of the first plurality of active load devices for sequentially activating or deactivating the active load devices in response to a first input signal received by the control circuit, the control circuit having a first inverter having an output coupled to the control terminal of one of the first plurality of active load devices, a second inverter having an output coupled to an input of the first inverter; and
    forcing circuitry coupled to the first and second inverters to couple the output of the second inverter to either the first voltage terminal or a second voltage terminal based upon an input of the second inverter and an output of the first inverter.

2. The output driver circuit of claim 1, further comprising a first adjustable voltage divider circuit interposed between the first plurality of active load devices and the first voltage terminal.

3. The output driver circuit of claim 1, further comprising a second plurality of active load devices electrically coupled between the output node and the second voltage terminal, each active load device of the second plurality of active load devices having a control terminal, wherein the control circuit is further coupled to each of the control terminals of the active load devices of the second plurality of active load devices for sequentially activating or deactivating the active load devices of the second plurality of active load devices in response to a second input signal received by the control circuit, the control circuit having a third inverter having an output coupled to the control terminal of one of the second plurality of active load devices, and a fourth inverter having an output coupled to an input of the third inverter.

4. The output driver circuit of claim 3, wherein the control circuit further comprises forcing circuitry coupled to the third and fourth inverters to couple the output of the second inverter to either the first or second voltage terminals based upon an input of the fourth inverter and an output of the third inverter.

5. The output driver circuit of claim 4 wherein the forcing circuit comprises:
    a forcing node coupled to the output of the second inverter;
    first and second p-type transistors, each having a control terminal, coupled in series between the first voltage terminal and the forcing node; and first and second n-type transistors, each having a control terminal, coupled in series between the forcing node and the second voltage terminal, wherein the control terminals of the first p-type and n-type transistors are coupled to the input of the second inverter and the control terminals of the second p-type and n-type transistors are coupled to the output of the first inverter.

6. The output driver circuit of claim 3, further comprising a second adjustable voltage divider circuit interposed between the second plurality of active load devices and the second voltage terminal.

7. The output driver circuit of claim 3 wherein the first plurality of active load devices comprises n-type transistors and the second plurality of active load devices comprises p-type transistors, the output driver circuit further comprising:

a plurality of p-type capacitors, each capacitor coupled between a respective control terminal of the n-type transistors and the second voltage terminal; and a plurality of n-type capacitors, each capacitor coupled between a respective control terminal of the p-type transistors and the second voltage terminal.

8. The output driver circuit of claim 1, further comprising a capacitor coupled between the output of the second inverter and the second voltage terminal for delaying the activation or deactivation of the one of the first plurality of active load devices.

9. The output driver circuit of claim 3, further comprising a capacitor coupled between the output of the fourth inverter and the second voltage terminal for delaying the activation or deactivation of the one of the second plurality of active load devices.

10. An output driver circuit, comprising:

a first plurality of active load devices electrically coupled between an output node and a first voltage terminal, each active load device having a control terminal;

a second plurality of active load devices electrically coupled between the output node and a second voltage terminal, each active load device having a control terminal;

a control circuit coupled to the control terminals of the first and second pluralities of active load devices for sequentially activating and deactivating the active load devices of the first and second pluralities in response to an input signal, the control circuit having a first plurality of inverters, each inverter having an output coupled to a respective control terminal of the active load devices of the first and second pluralities of active load devices, and a second plurality of inverters, each inverter having an output coupled to an input of a respective one of the first plurality of inverters; and forcing circuitry coupled to the first and second plurality of inverters for selectively coupling the output of the second inverters to either the first voltage terminal or the second voltage terminal.

11. The output driver circuit of claim 10 wherein the first plurality of active load devices comprises a plurality of first-type transistors and the second plurality of active load devices comprises a plurality of second-type transistors.

12. The output driver circuit of claim 11, further comprising a plurality of second-type capacitors, each coupled between the control terminal of a respective one of the plurality of first-type transistors and the second voltage terminal, and a plurality of first-type capacitors each coupled between the control terminal of a respective one of the plurality of second-type transistors and the second voltage terminal.

13. The output driver circuit of claim 12 wherein the first-type is N-type and the second type is P-type.

14. The output driver circuit of claim 10 wherein the control circuit further comprises a plurality of capacitors, each capacitor coupled between the output of a respective one of the second plurality of inverters and the second voltage terminal.

15. The output driver circuit of claim 10, further comprising a first adjustable impedance interposed between the first plurality of active load devices and the first voltage terminal, and a second adjustable impedance interposed between the second plurality of active load devices and the second voltage terminal.

16. A method for producing an output signal having a variable slew rate in response to an input signal, comprising:

generating a first sequence of activation signals in response to the input signal, the first sequence of activation signals having an increasing delay with respect to the input signal;

feeding forward the input signal and feeding back a respective one of the first sequence of activation signals to a forcing circuit; and applying each of the activation signals of the first sequence of activation signals to a respective control terminal of a first plurality of active load devices coupled between a first voltage terminal and an output node to sequentially activate or deactivate the first plurality of active load devices.

17. The method of claim 16, further comprising:

generating a second sequence of activation signals in response to the complement of the input signal, the second sequence of activation signals having an increasing delay with respect to the complement of the input signal; and applying each of the activation signals of the second sequence of activation signals to a respective control terminal of a second plurality of active load devices coupled the output node and a second voltage terminal to sequentially activate or deactivate the second plurality of active load devices.

18. The method of claim 17, further comprising matching the output load of the control terminals of the first and second plurality of active load devices.

19. The method of claim 16, further comprising adjusting an impedance between a supply voltage terminal and the first voltage terminal to adjust a voltage value of the first voltage terminal.

20. The method of claim 16 wherein generating a sequence of activation signals comprises applying the input signal to a plurality of delay circuits having increasing propagation delay times.

* * * * *